United States Patent [19]

Ichinose et al.

[11] Patent Number: 4,709,354

[45] Date of Patent: Nov. 24, 1987

[54] SEMICONDUCTOR MEMORY DEVICE

[75] Inventors: Katsuki Ichinose; Hirofumi Shinohara, both of Itami, Japan

[73] Assignee: Mitsubishi Denki Kabushiki Kaisha, Tokyo, Japan

[21] Appl. No.: 788,228

[22] Filed: Oct. 16, 1985

[30] Foreign Application Priority Data

Oct. 16, 1984 [JP] Japan .................................. 59-217836

[51] Int. Cl.⁴ .............................................. G11C 11/40
[52] U.S. Cl. ..................................... 365/226; 365/189
[58] Field of Search ................. 365/226, 227, 189, 230

[56] References Cited
PUBLICATIONS

A 64Kb CMOS RAM, by Satoshi Konishi et al., ISSCC Digest of Technical Papers (1982).
A 20ns 64K CMOS SRAM, by Osamu Minato et al., ISSCC Digest of Technical Papers (1984).

Primary Examiner—Terrell W. Fears
Attorney, Agent, or Firm—Birch, Stewart Kolasch & Birch

[57] ABSTRACT

A semiconductor memory device includes a plurality of memory cell rows each including a plurality of memory cells; a plurality of row selection signal lines each for transmitting a row selection signal to the memory cells of each memory cell row; and a row decoder for giving a row selection signal to the row selection signal line connected to the memory cells on a memory cell row in accordance with the row address input externally, wherein the row selection signal is at a power supply voltage level during a reading-out period, an intermediate voltage level between the power supply voltage and a ground level during the writing-in period, and the ground level at periods other than the writing-in and reading-out periods.

1 Claim, 4 Drawing Figures

SEMICONDUCTOR MEMORY DEVICE

FIELD OF THE INVENTION

The present invention relates to a semiconductor memory device, and more particularly to an improvement of the row selection signal in a row decoder circuit therein to reduce power consumption.

BACKGROUND OF THE INVENTION

In order to explain the background of the invention, reference will be particularly made to FIG. 2.

FIG. 2(a) shows a static semiconductor memory device, in which the reference numeral 1 designates a memory cell, the numeral 2 designates a memory cell row including a plurality of memory cells 1, and the numeral 3 designates a row decoder constituted by NAND circuits and the like. The row decoder 3 applies a power supply voltage Vcc to a row selection signal line corresponding to the row address. The numeral 4 designates a row selection signal line, the numeral 5 designates a bit line, the numeral 6 designates a peripheral circuit, and the numeral 7 designates a bit line load transistor including some other circuits.

FIG. 2(b) is a timing diagram showing the row selection signal which is applied to memory cells 1 on a memory cell row 2 through a row selection signal line 4. The reference numeral 8 designates a row selection signal, the numeral 9 designates a reading-out period, and the numeral 10 designates a writing-in period.

The device operates as follows:

When none of the memory cells 1 are selected, all of the row selection signal lines 4 are at ground level. When a memory cell 1 is selected, the voltage of the row selection signal line 4 which is connected to the memory cell 1 rises to the power supply voltage Vcc by the row decoder 3. As a result, a memory cell row 2 including the memory cell 1 is selected.

When the memory cell row is selected, a column current flows from the power supply Vcc through the bit line load transistor 7 and the bit line 5 to the memory cell 1 in the selected memory cell row 2. This column current flows through the bit lines connected to all the memory cells of the selected memory cell row 2 during the period when the voltage of the row selection signal line 4 is equal to the power supply voltage. In order to reduce the current consumption, the row selection signal line 4 is made to rise to the power supply voltage level Vcc only during the reading-out period 9 and the writing-in period 10 of predetermined lengths so as to prevent the column current from flowing except for the reading-out and writing-in periods 9 and 10.

As described above, in this prior art semiconductor memory device, the row selection signal 8 is made to rise to the power supply voltage level during both of the reading-out and writing-in periods 9 and 10. In this device, however, the row selection signal 8 is made to rise to the power supply voltage level even during the writing-in period 10 regardless of the fact that the row selection signal 8 can be written in by a lower voltage than the power supply voltage, which results in a wasteful power consumption of the column current to the extent that the voltage of the row selection signal exceeds the maximum required voltage.

Another prior art semiconductor memory device is disclosed in an article "A 64Kb CMOS RAM", by Satoshi Konishi et al., ISSCC Digest of Technical Papers (1982). In this 64Kb CMOS RAM, a change of address is detected to generate an internal clock and to precharge the bit lines by one-shot pulses, thereby reducing the DC current in the memory operation.

Another prior art semiconductor device is disclosed in an article "A 20 ns 64Kb CMOS RAM", by Osamu Minato et al., ISSCC Digest of Technical Papers (1984). In this article, the change of address is detected to generate an internal clock and to thereby make the word line level operate in a clockwise manner, thereby reducing the current consumption in the memory operation.

SUMMARY OF THE INVENTION

The present invention is directed to solve the problems pointed out above with respect to the prior art device, and has for its object to provide a semiconductor memory device capable of reducing the power consumption by suppressing useless column current.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, there is provided a semiconductor memory device comprising: a plurality of memory cell rows each including a plurality of memory cells; a plurality of row selection signal lines each for transmitting a row selection signal to the memory cells of each memory cell row; and a row decoder for applying a row selection signal to the row selection signal line connected to the memory cells on a memory cell row in accordance with the row address externally input, wherein the row selection signal is at a power supply voltage level during the reading-out period, an intermediate voltage level between the power supply voltage and ground level during the writing-in period, and at ground level at periods other than the writing-in and reading-out periods.

DETAILED DESCRIPTION OF THE PREFERRED EMBODIMENTS

Figure 1A:
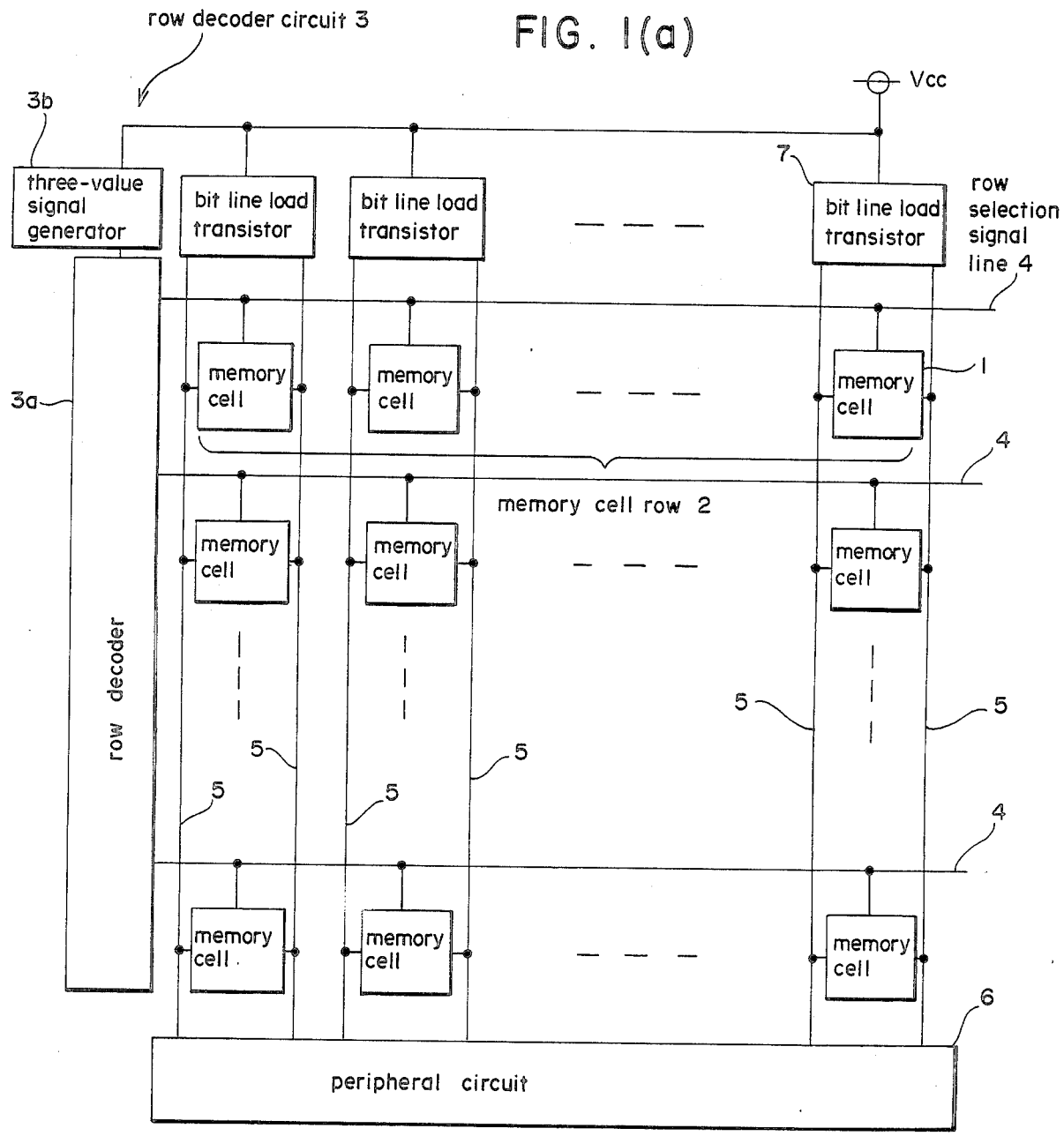
FIG. 1(a) is a diagram showing a construction of a semiconductor memory device as one embodiment of the present invention.
Figure 2A:
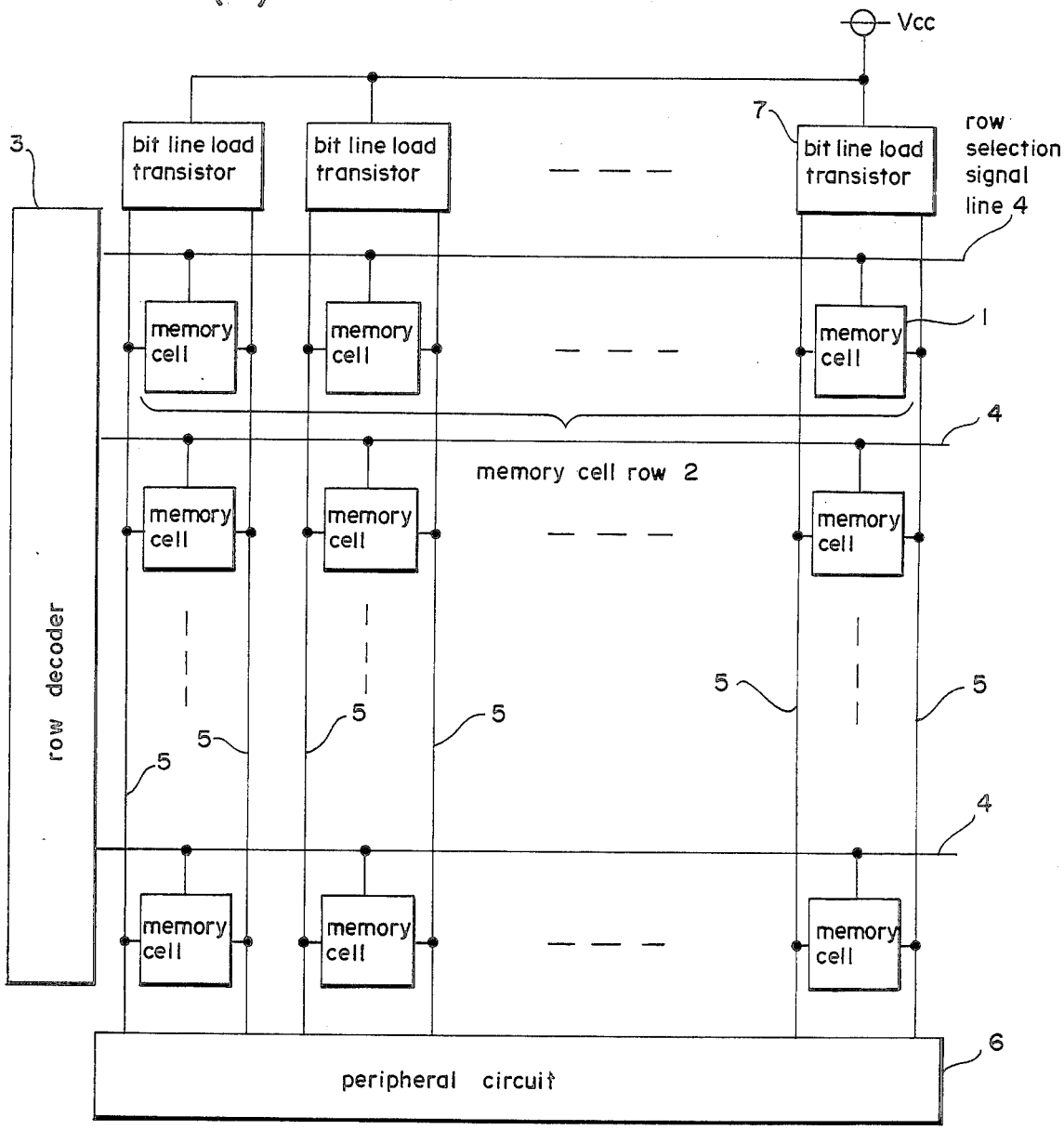
FIG. 2(a) is a diagram showing the construction of the prior art semiconductor memory device.
Figure 2B:
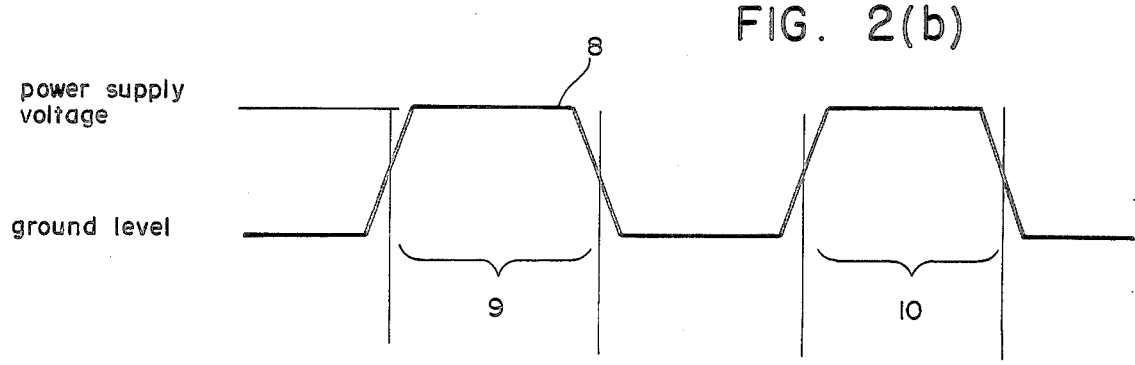
FIG. 2(b) is a timing diagram showing the row selection signal of FIG. 2(a).

In order to explain the present invention in detail, reference will be particularly made to FIGS. 1(a) and (b):

In FIG. 1(a), the reference numeral 1 designates a memory cell, the numeral 2 designates a memory cell row including a plurality of memory cells 1, the numeral 3 designates a row decoder circuit including a row decoder 3a and a three-value signal generator 3b. The row decoder 3a is constituted in a similar manner to the row decoder 3 of the prior art device of FIG. 2, but this row decoder 3a operates with the output voltage of the three-value signal generator 3b as its power supply voltage.

The three-value signal generator 3b is intended to generate an intermediate voltage in the writing-in period when the writing-in pulse is externally input, to generate the power supply voltage in the reading-out cycle of a predetermined period which begins when an internal synchronous signal is input thereto which signal is generated by detecting the change of the input address inside the memory device, and to generate a ground level signal at other than those periods.

Furthermore, the reference numeral 4 designates a row selection signal line, the numeral 5 designates a bit line, the numeral 6 designates a peripheral circuit, and the numeral 7 designates a bit line load transistor including some other circuits.

Figure 1B:
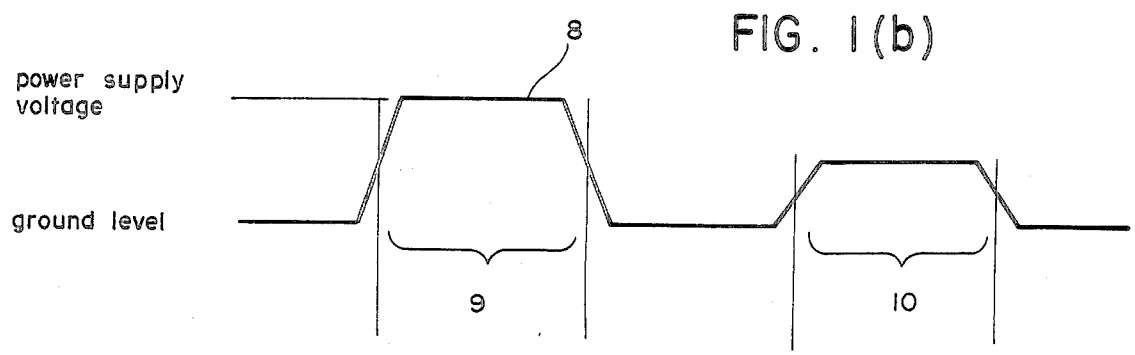
FIG. 1(b) is a timing diagram showing the row selection signal of FIG. 1(a)

FIG. 1(b) is a timing diagram showing the row selection signal which is applied to memory cells 1 on a memory cell row 2 through a row selection signal line 4 of FIG. 1(a). The reference numeral 8 designates a row selection signal, the numeral 9 designates a reading-out period, and the numeral 10 designates a writing-in period.

The device operates as follows:

When a memory cell 1 is selected, the voltage of the row selection signal line 4 which is connected to the memory cell 1 corresponding to the row address is made to rise to the power supply voltage level Vcc by the row decoder circuit 3 in accordance with the row address that is externally input, and a memory cell row 2 including the memory cell 1 is selected. When this memory cell row 2 is selected, a column current flows from the power supply through the bit line load transistor 7 and the bit line 5 to the memory cell 1 in the selected memory cell row 2.

The column current continues to flow through the bit lines connected to all of the memory cells 1 on the selected memory cell row 2 during the period when the row selection signal line 4 is at the power supply voltage level. The row decoder circuit 3 of the present invention keeps the voltage of the row selection signal line 4 at the power supply voltage level during the reading-out period 9, at an intermediate voltage level lower than the power supply voltage during the writing-in period 10, and at the ground level at periods other than those periods. Thus, the column current flowing during the writing-in period 10 can be reduced as compared with the case where the voltage of the row selection signal line 4 is at the power supply voltage level during the writing-in period 10. In this case, it is possible to conduct the writing-in operation without lengthening the writing-in period even if the voltage of the row selection signal line 4 is at an intermediate voltage level below the power supply voltage.

As evident from the foregoing, according to the present invention, the voltage of the row selection signal line is kept at an intermediate voltage level below the power supply voltage during the writing-in period, thereby enabling a reduction in the column current during the writing-in period. As a result, a semiconductor memory device having a low power consumption can be attained.

What is claimed is:

1. A semiconductor memory device comprising:
   a plurality of memory cell rows each including a plurality of memory cells;
   a plurality of row selection signal lines each connected to a said memory cell row for transmitting a row selection signal to the memory cells of said memory cell row; and
   a row decoder for applying a row selection signal to the row selection signal line connected to the memory cell row corresponding to a row address input externally, wherein the row selection signal is at a power supply voltage level during a reading-out period, an intermediate voltage level less than the power supply voltage level during a writing-in period, and at ground level during periods other than the writing-in and reading-out periods.

* * * * *